United States Patent [19]

Pluntke et al.

[11] Patent Number: 5,343,069

[45] Date of Patent: Aug. 30, 1994

[54] ELECTRONIC SWITCH WITH A DEFINITE BREAKDOWN VOLTAGE

[75] Inventors: Christian Pluntke, Hechingen; Alfred Goerlach, Kusterdingen, both of Fed. Rep. of Germany

[73] Assignee: Robert Bosch GmbH, Stuttgart, Fed. Rep. of Germany

[21] Appl. No.: 27,162

[22] Filed: Feb. 26, 1993

[30] Foreign Application Priority Data

Nov. 8, 1990 [DE] Fed. Rep. of Germany ....... 4035500

[51] Int. Cl.$^5$ ...................... H01L 29/72; H01L 29/90
[52] U.S. Cl. .................... 257/583; 257/496; 257/600; 257/653; 257/654
[58] Field of Search ............... 257/653, 654, 168, 170, 257/171, 401, 409, 465, 496, 600, 583, 589

[56] References Cited

U.S. PATENT DOCUMENTS

| | | | |
|---|---|---|---|
| 3,758,832 | 9/1973 | Platzoder | 257/171 |
| 3,975,754 | 8/1976 | Lehmann | 257/171 |
| 4,774,560 | 9/1988 | Coe | 257/653 |
| 4,823,176 | 4/1989 | Baligr et al. | 257/401 |
| 5,191,396 | 3/1993 | Lidon et al. | 257/409 |

OTHER PUBLICATIONS

S. M. Sze, "Physics of Semiconductor Devices", 1981.

*Primary Examiner*—Ngan Van Ngo
*Attorney, Agent, or Firm*—Michael J. Striker

[57] ABSTRACT

An electronic switch, in particular a transistor, has at least one barrier layer extending between regions of different doping concentrations within a semiconductor and is characterized in that the barrier layer has at least one voltage limiting zone (Z) having a radius of curvature (R) less than or at most equal to the diffusion depth ($x_{JB}$) of the diffused junction.

10 Claims, 6 Drawing Sheets

ELECTRONIC SWITCH WITH A DEFINITE BREAKDOWN VOLTAGE

BACKGROUND OF THE INVENTION

The invention relates to an electronic switch, particularly in the form of a transistor.

An electronic switch is known comprising a semiconductor having a particular doping type and an upper surface. A doping zone can be introduced into the upper surface of the semiconductor by diffusion to form a pn-junction when the doping of the doping zone is of a type opposite to the doping type of the semiconductor body. Electronic switches such as transistors and diodes based on semiconductors are known. For example, if a bipolar transistor with common-emitter connection is to be operated in the avalanche breakdown region at high current densities, it is usually more advantageous if the breakdown voltage is not reached between the collector and emitter with open base because of the risk of destruction by the second breakdown, the so-called reverse second breakdown. As in other circuits with electronic switches, a Zener diode with or without a voltage divider can be used for limiting voltage. An external voltage limiting circuit can be connected to the electronic switch of this type or it can be integrated into the semiconductor. External connection entails additional production cost and the circuitry space requirement is increased. Integrating the voltage limiting circuit in the semiconductor of the electronic switch, e.g. by a planar technique, likewise involves a more costly production process for the electronic switch due to the additional components of the limiting circuit.

SUMMARY OF THE INVENTION

It is an object of the present invention to provide an improved electronic switch, particularly a transistor, which does not have the above-described disadvantages.

According to the invention, the electronic switch comprises a semiconductor body of a predetermined doping type having an upper surface and a doping zone introduced in the upper surface of a doping type opposite to the predetermined doping type, the doping zone forming a pn-junction in the semiconductor body, the pn-junction having an edge region at the upper surface. The pn-junction has at least one voltage limiting zone arranged in the edge region with at least one curved region having a radius of curvature not greater than a thickness $X_{JB}$ of the doping zone.

The electronic switch, according to the invention, has the advantage over the prior art that the arrangement for limiting the breakdown voltage can be integrated in the semiconductor body of the electronic switch without having to change the production process. This brings about practically no increase in the cost of producing the voltage-protected electronic switch. Added connections for limiting the voltage can be dispensed with.

In a preferred embodiment of the switch, the voltage limiting zone is arranged in an edge region of the barrier layer or pn junction which is arranged approximately vertically on the surface of the semiconductor intersecting the barrier layer or zone. This means that the surface area of a doping layer introduced in the substrate of the switch remains unchanged. Accordingly, the voltage limiting zone has fundamentally no negative influence on the switching behavior of the switch.

In another preferred embodiment of the electronic switch, a voltage limiting zone is provided which is characterized in that a plurality of directly adjacent, alternately concave and convex regions which are preferably constructed so as to be practically hemispherical are provided at the edge of the barrier layer or of the pn junction of a diffused junction. Such a structure of the voltage limiting zone prevents excessively high local current densities which could lead to excessive heating of the component. Moreover, a relatively sharp breakdown characteristic line results, i.e. the breakdown voltage does not depend on the current.

Further, in a preferred embodiment of the electronic switch the voltage limiting zone has a plurality of curved, preferably substantially hemispherical regions which are connected by straight portions. An exactly defined breakdown behavior can also be adjusted by means of this structure of the barrier layer or pn junction region. The breakdown characteristic can also be adapted to the desired application.

Various preferred embodiments of the above invention are possible.

BRIEF DESCRIPTION OF THE DRAWING

The invention is explained in more detail in the following with reference to the drawing showing two embodiments.

DETAILED DESCRIPTION OF THE PREFERRED EMBODIMENTS

The invention is explained in the following by way of example with reference to a transistor. However, the voltage limiting device according to the invention is applicable to electronic switches of all kinds, e.g. also for diodes, thyristors, Darlington transistors, and ignition transistors. It can be used for npn as well as pnp transistors.

Figure 1:
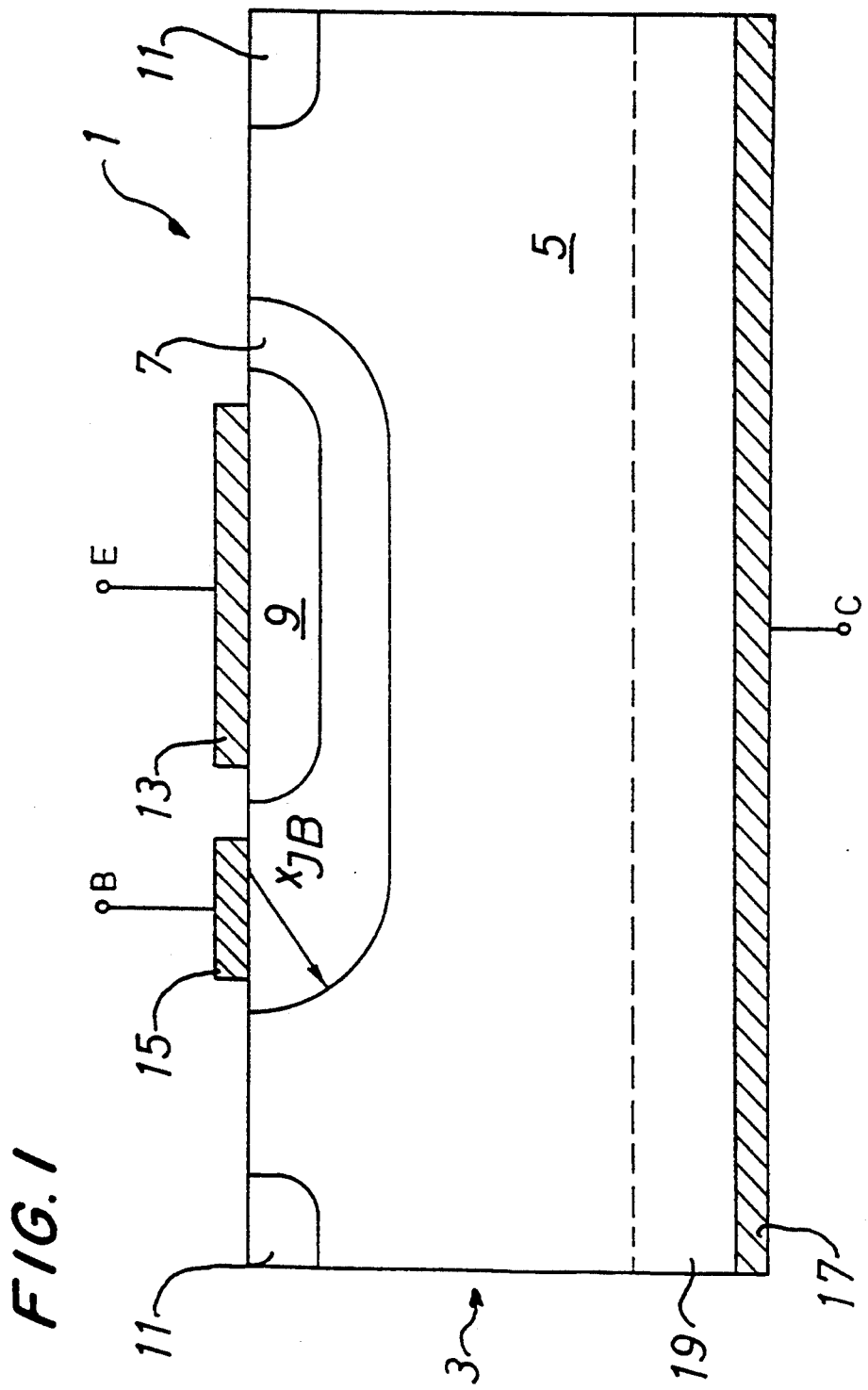
FIG. 1 is a schematic cross-sectional view through an electronic switch constructed as a planar vertical power transistor.

FIG. 1 shows a planar npn power transistor. For the sake of clarity the oxide layers are not shown in the drawing.

The transistor 1 has a semiconductor 3 with regions of different doping concentrations. A first diffused junction, in this instance a p-doped base trough 7, is introduced in a high-resistance n− collector layer 5. The doping reaches to a depth $X_{JB}$. Another layer is diffused into the base trough 7; this is a n+-doped layer serving as emitter 9. Additional n+-doped layers serving as channel stoppers 11 are introduced by diffusion into the surface of the semiconductor 3 at a distance from the base trough 7.

A first conductive, preferably metallic contact 13 is vapor deposited on the n+-doped layer of the emitter 9 and is connected with an emitter contact E so as to be electrically conducting. A second metallic contact 15 which is connected with a base contact B so as to be electrically conducting is likewise arranged, e.g. vapor deposited, on the upper side of the semiconductor in the region of the base trough 7.

A metallic layer 17 which is connected with a collector contact C so as to be electrically conducting is arranged on the side of the substrate or semiconductor 3 located opposite the emitter contact E or base contact B. In the region of the metallic layer 17, the substrate body has a layer 19 with lower resistance than the rest of the collector layer 7.

Barrier layers whose shapes are shown by lines in FIG. 1 are provided between the regions of different doping levels. The drawing shows that the barrier layers forming the bottom surfaces of the layers diffused into the substrate 3, i.e. the underside of the base trough 7 and of the n+-doped layer of the emitter 9, are constructed in a planar manner and extend substantially parallel to the upper side of the transistor 1. As a result of the diffusion process during the production of the layers, the barrier layers have a curved region in the edge regions of the doped layers, i.e. the side walls of the layers—proceeding from the bottom surface—extend somewhat cylindrically rather than at right angles. The transitional area between the bottom surface of the doped layers and the upper surface of the semiconductor thus extends along the outer surface area of a cylinder whose radius corresponds to the depth $X_{JB}$ of the doped layer. Finally, the barrier layer intersects the upper surface of the semiconductor 3 at an angle of approximately 900.

Figure 2:
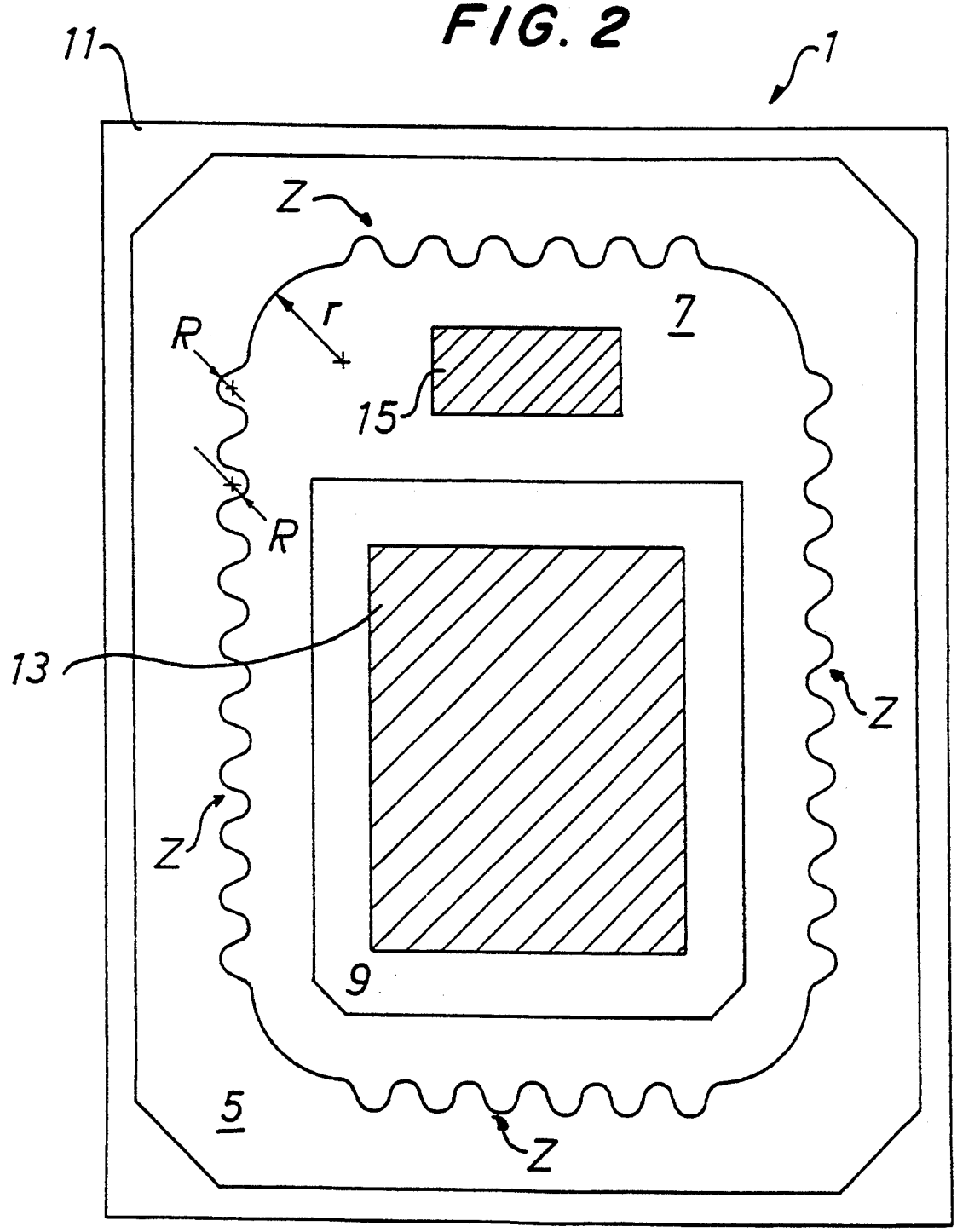
FIG. 2 is a schematic top view of the electronic switch according to FIG. 1.

Identical parts of the electronic switch or transistor 1 shown in FIG. 1 are provided with the same reference numbers in the schematic top view according to FIG. 2, so that the description of FIG. 1 is referred to in this respect.

The top view shows that the upper side of the transistor 1 is enclosed to some extent by a frame which is formed by the diffused junction serving as channel stopper 11. The n−-doped collector layer 5 adjoins this n+-doped layer. The transitional or edge region or barrier layer between this layer and the adjoining p-doped base 7, i.e. the pn junction of the transistor 1, is not constructed in the manner of a straight line at least in some areas. seen as a whole, the base trough is substantially rectangular. A curvature with radius r is provided in the area of the corners. The longitudinal and transverse sides of the base trough have a plurality of adjoining arc-shaped areas with a radius of curvature R. Concave and convex regions follow immediately one after the other in an alternating manner. These curved regions form voltage limiting zones Z. As can clearly be seen, the radius of curvature R is substantially smaller than the radius r in the corner regions of the base trough.

The metallic surface, designated as second contact 15, is vapor deposited on a region of the upper side, the base contact B, not shown here, (see FIG. 1) being connected to the latter so as to be electrically conductive.

The emitter 9 which is also constructed so as to be substantially rectangular in the present case is arranged inside the base trough 7, the metallic surface designated as first contact 13 being vapor deposited on its surface.

This metallic surface serves for the electrical connection of the emitter contact E, likewise not shown here (see FIG. 1).

Figure 3:
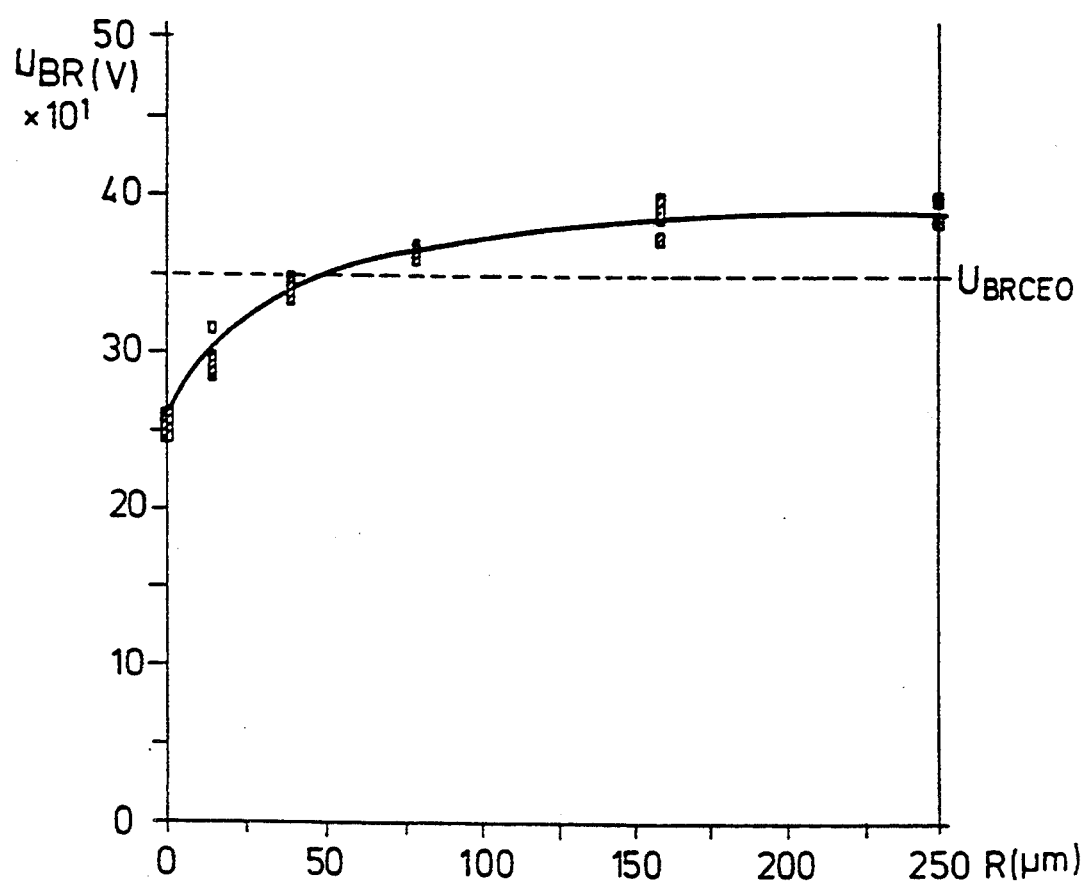
FIG. 3 is a graphical illustration of the dependence of the breakdown voltage $U_{BR}$ on the radius of curvature R.

It can be seen from FIG. 3 that the voltage limiting of the voltage limiting zone Z depends on the radius of curvature R of the individual curved regions. This diagram shows the dependency of the limiting voltage $U_{BR}$ (measured in volts) on the radius of curvature R (measured in um). The breakdown voltage $U_{BRCEO}$ between the collector and emitter with open base is shown by a dashed line.

Figure 4:
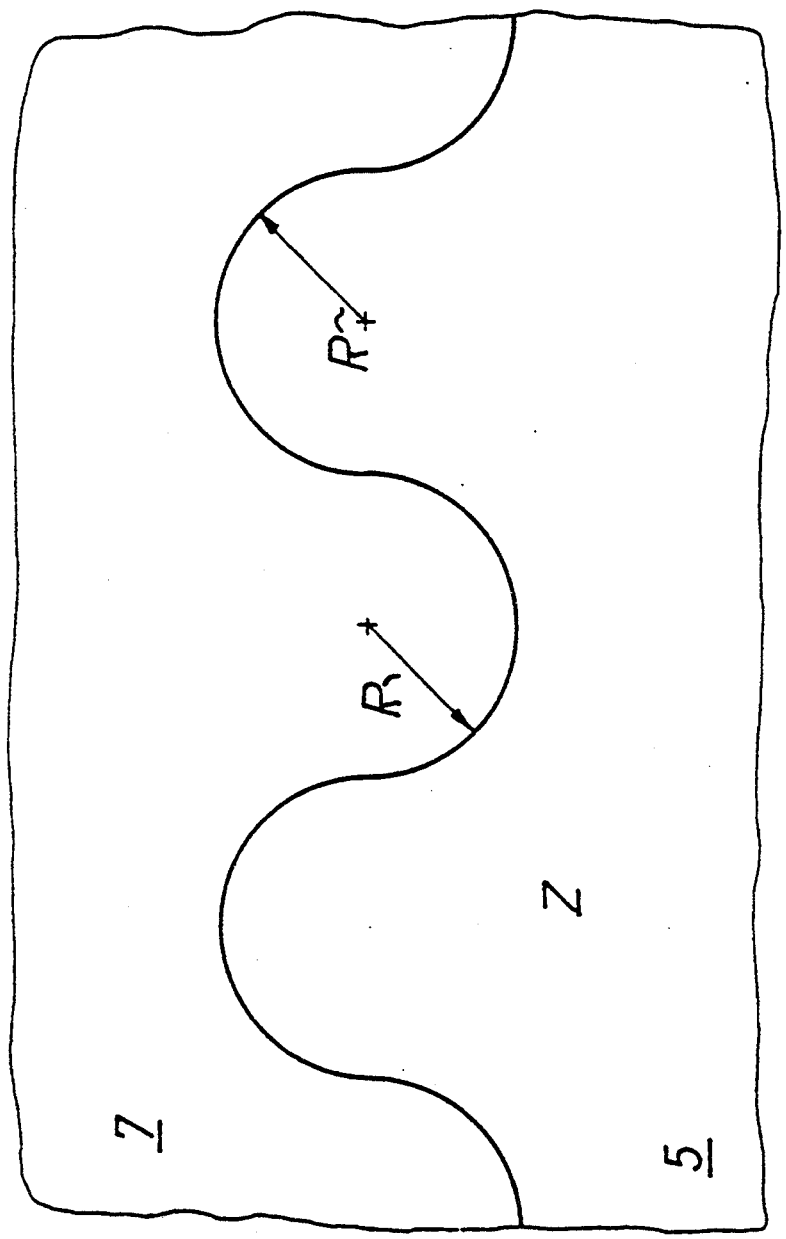
FIG. 4 is a detailed cutaway top plan view of the pn junction of the electronic switch according to FIGS. 1 and 2.

FIG. 4 shows a section of a region of the pn junction or edge between the base and collector serving as voltage limiting zone Z.

The surface designated by 5 shows the high-resistance collector layer and the surface 7 represents the base.

It can be seen from the drawing that the edge region of the barrier layer has areas which are curved in an arc-shaped manner whose radius of curvature is designated by R. The individual areas adjoin one another directly so that the edge zone has a somewhat S-shaped construction. In the present embodiment a concave area of the voltage limiting zone directly adjoins a convex area.

Figure 5:
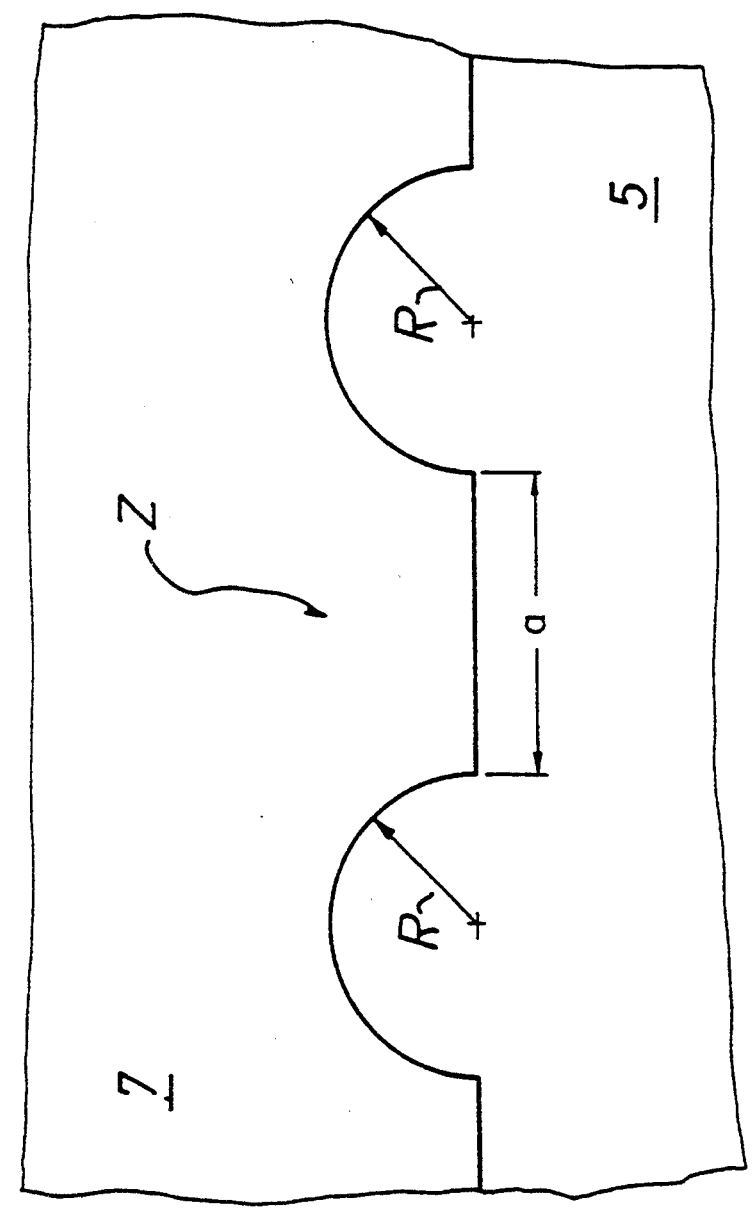
FIG. 5 is a detailed cutaway top plan view of the pn junction of another embodiment of the electronic switch.

FIG. 5 shows an enlarged view of the edge region of the barrier layer between the base and collector of a transistor or pn junction. However, it can be seen that curved areas alternate with straight portions in the embodiment example shown here. The curved areas have an arc shape and a radius of curvature R. The length of the straight-line areas is designated by a.

The maximum voltage $U_{BR}$ occurring at the electronic switch constructed as a transistor is limited between the collector and base by the special structure of the pn junction in the edge area of the barrier layer between the base and collector, which special construction is explained with reference to the drawings. In so doing, the limiting voltage $U_{BR}$ is lower than the breakdown voltage $U_{BRCEO}$ between the collector and emitter with open base. Thus:

$$U_{BR} < U_{BRCEO}.$$

A collector-emitter voltage $U_{CEO}$ occurs at the transistor given by the following equation:

$$U_{CEO} = U_{BR} + U_{BE},$$

where $U_{BE}$ designates the voltage drop across the base-emitter junction of the transistor.

It is assumed in the following considerations that the barrier layer or pn junction has a high doping gradient so that the base-collector junction can be treated as a pn junction which is abrupt on one side.

The structure of the diffused junction which is shown in FIG. 1 and serves as base 7 results in cylindrical pn− junctions with a cylinder radius of $X_{JB}$ in the edge area of the barrier layer. The avalanche breakdown voltage in these regions is less than in planar pn junctions as occur e.g. in infinitely elongated diffused junctions (so-called infinitely elongated pn junction).

If W designates the width of the space-charge region during breakdown and $U_{BRCEO}$ designates the breakdown voltage of the base-collector junction with open emitter, the following equation is given:

$$U_{BRCEO}^{ZYL} < U_{BRCBO}^{EBEN}$$

This equation is true provided that the thickness of the doping layer and accordingly the radius $x_{JB}$ of the cylindrically curved edge region is at most equal to the width of the space-charge region, i.e. when $x_{JB} \leq W$.

The breakdown voltage $U_{BRCEO}^{ZYL}$ decreases as the cylinder radius $x_{JB}$ decreases. To ensure reliable voltage limiting, the condition $U_{BRCBO} < U_{BRCEO}$ must be met. The following equation is given by approximation for the minimum $U_{CEO}$ breakdown voltage $U_{BRCEO}$:

$$U_{BRCEO} = U_{BRCBO}^{EBEN}/(B+1)^{(1/n)}.$$

The small-signal current gain of the transistor is designated by B and n is a constant. It follows from this equation that $U_{BRCEO}$ is inversely proportional to B, that is, $$U_{BRCEO} << U_{BRCBO}^{EBEN}.$$

A further reduction in the breakdown voltage with abrupt pn junctions can be achieved by means of the voltage limiting zones Z shown in FIG. 2 which have at least one area with a substantially circular curvature. The smaller the radius of curvature R, the lower the breakdown voltage $U_{BR}$. When the radius of curvature approximately corresponds to the layer thickness $X_{JB}$, i.e. for the equation $x_{JB}=R$, the limiting case of the spherical pn junction is reached. The influence of the radius of curvature R on the reduction of breakdown voltage becomes more pronounced, the more abrupt or spherical the pn junction. A clear influence of the radius of curvature R on the breakdown voltage with abrupt pn junctions is given when the condition $R \leq W$ is met, i.e. when the radius of curvature is less than or at most equal to the width W of the space-charge region during breakdown.

The relationships between the radius of curvature R and the breakdown voltage $U_{BR}$ with a pn junction are shown in FIG. 3 by a graph in which the breakdown voltage is plotted over the radius of curvature. The conditions in a n$^-$ diode with radius of curvature R were taken into account in so doing, i.e. circular p-zones with different radii R are introduced into a substrate of 60 ohm/centimeter n$^-$ silicon. The penetration depth $x_{JB}$ of the p-layer doped with boron is approximately 9 um. The dependency of the breakdown voltage $U_{BR}$ on the radius of curvature R follows from the drawing. The breakdown voltage decreases as the radius of curvature R decreases. For the limiting case of the spherical pn-junction, R assumes the value of 0, i.e. there is a right angle instead of a circle.

If the doping profile from FIG. 3 is carried over to a base-collector junction of a npn transistor, where $U_{BR}$ corresponds to the voltage $U_{BRCBO}$, the minimum $U_{CBO}$ breakdown voltage could amount to 350 V, for example, as a result of a suitable emitter. The desired $U_{BCO}$ voltage limiting is then obtained for radii of curvature with $R < 50$ um.

In principle, a reduction in the blocking voltage can be achieved with a single voltage limiting zone, i.e. with a single location with a radius of curvature R in the pn junction or in the edge region of the base 7 opposite the collector 1. However, in some cases of application, relatively high current densities occur in this area which lead to intensive heating of the component and may also damage this component. Moreover, a soft breakdown characteristic line results, which is undesirable for many applications.

For this reason, the pn junction or edge region between the base 7 and collector 5 is preferably provided with numerous curved areas so as to form at least one voltage limiting zone Z as is shown in FIG. 2.

The exact construction of the edge region is shown once again in FIGS. 4 and 5. One of the possible constructions of a base edge contour is shown in FIG. 4. It includes a plurality of alternately concave and convex areas which directly adjoin one another. To achieve an effective voltage limiting the radius of curvature R must correspond approximately to the width W of the space-charge region in breakdown.

Another example for the construction of the pn junction or edge region between the base 7 and the collector 5 is shown in FIG. 5. Here, also, the region of the collector 5 is separated from the region of the base 7 by the base edge. However, in this case the base edge includes half-circles with radius of curvature R which alternate with straight regions of length a. To achieve an optimal voltage limiting the radius of curvature R may correspond at most to width W of the space-charge region in breakdown so as to give the equation $R \leq W$, and it must follow for a that the straight area is not less than twice the width W of the space-charge region in breakdown so as to give the equation $a \geq 2W$.

In principle, the pn junction or base edge region can be optionally constructed to achieve the desired voltage limiting and to adjust a desired breakdown characteristic line.

In the embodiment examples shown here the voltage limiting is achieved in that regions of the transistors themselves are specially constructed. It is evident that the production of the transistor per se remains unchanged by integrating the voltage limiting zones. That is, the cost of production is practically the same. However, it is also possible for the transistors to be associated with switching elements with at least one voltage limiting zone Z, as shown for example in FIGS. 4 and 5, and to construct these switching elements separately from the transistor.

By integrating the voltage limiting zone inside the semiconductor the region serving for voltage limiting can also be protected from external influences by a protective layer over the surface of the chip. The voltage limiting is also not impaired if regions with a reduced radius of curvature are covered by a dielectric and/or with a metallic layer.

The voltage limiting suggested here can be combined with regular voltage limiting devices to increase the operating reliability of circuits.

In the voltage limiting suggested here it is ensured that the $U_{CEO}$ breakdown vertical to the surface of the semiconductor remains practically unchanged. This is because the voltage limiting is achieved solely by the special structure of the edge region of the pn junction, i.e. by the structure of the edge of the base trough.

Figure 6:
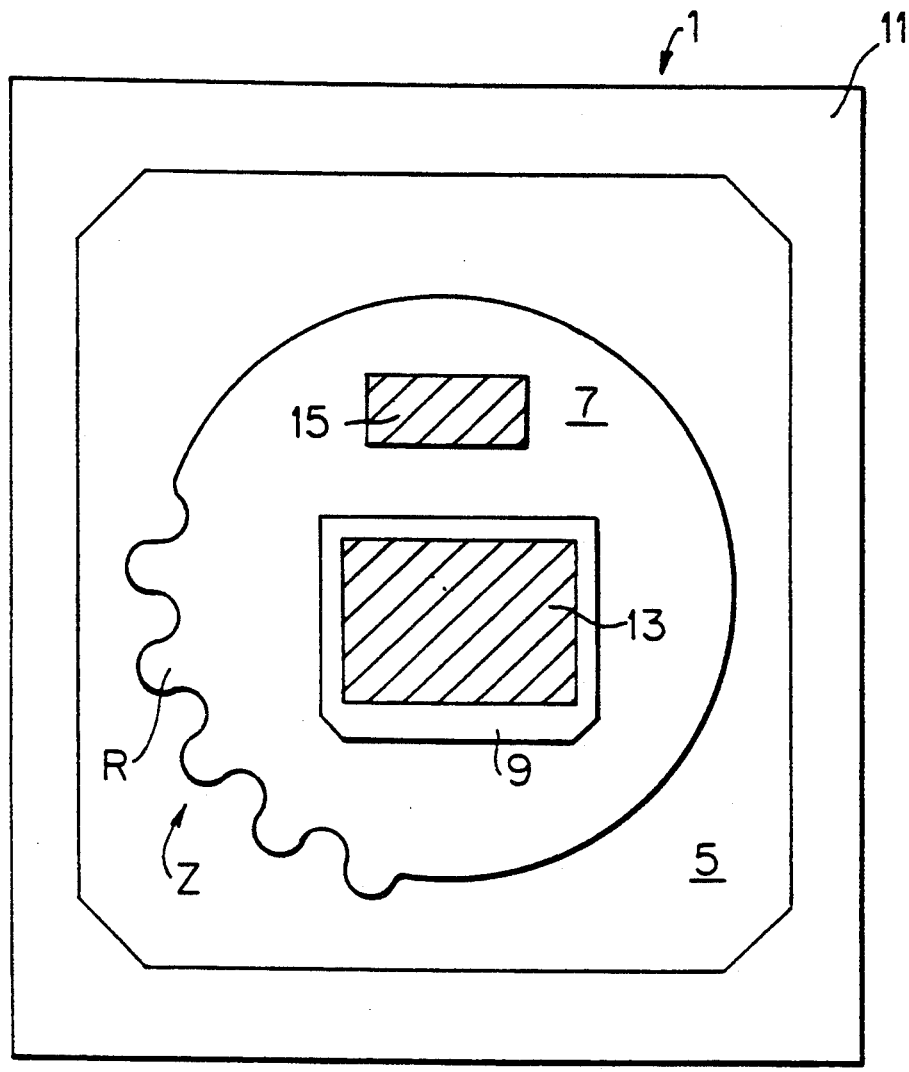
FIG. 6 is a schematic top view of another embodiment of the electronic switch similar to that of FIG. 2.

FIG. 6 is an alternative embodiment of the switch in which the edge region of the pn-junction is circular and has one of the voltage limiting regions Z. Elements with the same number as in FIG. 2 are the same in the embodiment of FIG. 6.

Although the invention has been illustrated and described as embodied in an electronic switch with a definite breakdown voltage, particularly in the form of a transistor, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. Electronic switch comprising a semiconductor body (3) of a predetermined doping type having an upper surface and a doping zone (7) introduced in said upper surface and of a predetermined doping type opposite from said predetermined doping type of the semiconductor body, said doping zone (7) forming a pn-junction in said semiconductor body (3), said pn-junction having an edge region at said upper surface,
   wherein said pn-junction has at least one voltage limiting zone (Z) arranged in the edge region and having at least one curved region of a radius of curvature (R), said radius of curvature (R) being not greater than a thickness ($X_{JB}$) of the doping zone (7).

2. Electronic switch as defined in claim 1, wherein said at least one voltage limiting zone (Z) is provided with a plurality of said curved regions positioned directly adjacent to each other and curved in an alternatingly concave and convex manner.

3. Electronic switch as defined in claim 2, wherein said curved regions are hemispherical.

4. Electronic switch as defined in claim 1, wherein said at least one voltage limiting zone (Z) is provided with a plurality of said curved regions, each of said curved regions being connected to adjacent ones of said curved regions by respective straight segments.

5. Electronic switch as defined in claim 4, wherein said curved regions are hemispherical.

6. Electronic switch as defined in claim 4, wherein each of said straight segments has a length (a) and said length (a) is greater than twice a width of a space-charge region during breakdown.

7. Electronic switch as defined in claim 1, wherein said edge region of said pn-junction is substantially rectangular having longitudinal sides and transverse sides, each of said longitudinal sides and said transverse sides having at least one of said voltage limiting regions (Z).

8. Electronic switch as defined in claim 7, wherein the radius of curvature (R) of the curved regions is greater than a twice width of a space-charge region during breakdown.

9. Electronic switch as defined in claim 1, wherein said edge region of said pn-junction is substantially circular and has a circumference, said circumference having at least one of said voltage limiting regions (Z).

10. Electronic switch as defined in claim 9, wherein the radius of curvature (R) of the curved regions is greater than a twice width of a space-charge region during breakdown.

* * * * *